United States Patent [19]

Donzelli

[11] Patent Number: 4,871,687

[45] Date of Patent: Oct. 3, 1989

[54] METHOD OF FABRICATING A MESFET TRANSISTOR WITH GATE SPACED ABOVE SOURCE ELECTRODE BY LAYER OF AIR OR THE LIKE

[75] Inventor: Giampiero Donzelli, Milan, Italy

[73] Assignee: Telettra Telefonia Elettronica e Radio S.p.A., Milan, Italy

[21] Appl. No.: 261,142

[22] Filed: Oct. 24, 1988

Related U.S. Application Data

[62] Division of Ser. No. 201,353, May 26, 1988, Pat. No. 4,807,002.

[30] Foreign Application Priority Data

Jan. 28, 1988 [IT] Italy ............................... 19262 A/85

[51] Int. Cl.[4] .................................... H01L 23/48
[52] U.S. Cl. ..................... 437/40; 437/912; 437/927; 437/944; 357/22; 148/DIG. 142
[58] Field of Search ........... 437/40, 41, 64, 65, 437/175, 189, 912, 195, 182; 148/DIG. 142; 357/15, 69, 71, 55, 22 I, 22 H

[56] References Cited

U.S. PATENT DOCUMENTS

| 3,647,585 | 3/1972 | Fritzinger et al. | 357/71 |
| 4,054,484 | 10/1977 | Lesh et al. | 357/71 |
| 4,107,720 | 8/1978 | Pucel et al. | 357/22 H |

FOREIGN PATENT DOCUMENTS

| 0076437 | 5/1984 | Japan | 437/40 |
| 0080869 | 4/1986 | Japan | 437/41 |
| 0115877 | 5/1987 | Japan | 437/40 |

Primary Examiner—Brian E. Hearn
Assistant Examiner—Tuan Nguyen
Attorney, Agent, or Firm—Ostrolenk, Faber, Gerb & Soffen

[57] ABSTRACT

In a Schottky field effect MESFET transistor including a semiconductor substrate and source, gate and drain electrodes, the electrical resistance of the gate is reduced to substantially zero by implementing the gate electrode as a sheet of metallization which bypasses a portion of the source electrode and which is spaced from the source electrode by a layer of air or the like. The MESFET transistor may be fabricated by providing drain and source electrodes on a semiconductor substrate with the electrodes situated side-by-side. Photoresist is applied over at least the source electrode while leaving exposed (a) a first portion of the substrate surface between the source and drain electrodes and (b) a second portion of the substrate surface situated on an opposite side of the source electrode and which is used as a bonding pad location. Gate metallization is then formed over the photoresist and in contact with the first and second areas of the substrate surface. The metallization may also extend over the drain electrode that is later removed. Upon removal of the photoresist from between the gate and source electrodes, a layer of air of the like dielectrically separates these electrodes from each other. A portion of the gate metallization that overlies the drain electrode may exist as a tail that may have various lengths to make possible a non-critical patterning step for the gate metallization.

4 Claims, 3 Drawing Sheets

METHOD OF FABRICATING A MESFET TRANSISTOR WITH GATE SPACED ABOVE SOURCE ELECTRODE BY LAYER OF AIR OR THE LIKE

This is a division of application Ser. No. 201,353, filed May 26, 1988, now 4,807,002.

BACKGROUND OF THE INVENTION

The present invention relates to a novel structure and fabrication process for a Schottky barrier field effect MESFET transistor. More particularly, the present invention relates to a structure and fabrication process for such a MESFET transistor in which the gate resistance is negligible so as to improve microwave operation.

A typical MESFET (Metal Semiconductor Field Effect Transistor) includes a semiconductor substrate, a source electrode ("S"), a gate electrode ("G") and a drain electrode ("D"). For MESFET structures used in the microwave field, a radio frequency ("RF") signal applied to the gate electrode G results in an amplified output signal on the drain electrode D. The source electrode is generally grounded. For MESFET structures operated in the microwave range, the electrical resistance of the gate electrode has a large bearing on performance of the MESFET structures. A low gate electrode resistance is important for achieving high power and low noise in MESFET structures operated at very high (e.g. microwave) frequencies in which the dimensions of the gate electrode are typically below a micron. The foregoing restriction on gate width normally results in a large gate electrode resistance in prior art devices.

The approaches for reducing gate electrode resistance in prior art MESFET devices can be basically classified as follows:

(1) Increasing the thickness of the metallization of the gate electrodes; or (2) Decreasing the length of the individual arms of the gate electrode which, in a conventional device, comprise the individual arms of a "U"-shaped electrode.

As far as approach (1) is concerned, the gate electrode can only be increased in thickness to not more than 1 or 2 microns, due to various technological limitations. As to approach (2), reducing the length of the individual arms of the gate electrodes results in disadvantageously increasing the number of interconnections required per unit area of the device, which reduces manufacturing yield, and increasing the semiconductor area required for each MESFET device, particularly for power devices, which results in degraded device performance, especially at high frequencies.

SUMMARY OF THE INVENTION

An object of the invention is to provide a MESFET structure with a low gate resistance.

Another object of the invention is to provide a MESFET structure, with the foregoing feature of low gate resistance, and also including a reduced number of gate arms for reduced device dimensions while having good performance characteristics.

The foregoing and further objects of the invention are achieved in a MESFET structure including source S and drain D electrodes situated side-by-side and spaced from each other on a surface of a semiconductor substrate. A novelty configured gate electrode bridges over the source electrode and is spaced therefrom by a layer of air or the like. One side of the gate electrode is soldered or otherwise connected to the semiconductor surface situated between the source and drain electrodes. The other side of the gate electrode, situated on the other side of the source electrode, is connected to a semiconductor surface for a sufficiently large area so as to form a gate bonding pad. The lateral dimension of the gate electrode between its two points of contact to the semiconductor surface can be considerably greater than 1 micron so as to achieve a very low or even negligible gate resistance.

In a preferred embodiment of the invention, the source electrode S is "I"-shaped, i.e. it has an elongated central section and respective upper and lower "head" sections that extend laterally relative to the central elongated section. The gate electrode comprises a sheet with a longitudinal dimension slightly less and a transverse dimension considerably greater than the corresponding dimensions of the source electrode S. The longitudinal dimension of the drain electrode D is slightly greater than that of the gate electrode and the transverse dimension of the drain electrode D is of the same order of magnitude as that of the source electrode S.

Further preferred dimensions of the gate, source and drain electrodes of the present MESFET structure are described in detail hereinafter.

A novel method of fabricating the foregoing MESFET structure includes the following steps. Drain and source electrodes of suitable material for forming Schottky contacts are formed on a semiconductor substrate in a side-by-side arrangement. Photoresist material is applied over at least the source electrode while leaving exposed a first region between the source and drain electrodes and a second region on the opposite side of the source electrode from the first region where a gate bonding pad is desired. The gate electrode is then formed over photoresist that covers the source electrode and contacts the exposed semiconductor material both in the first and second regions, defined above. Then the photoresist material between the gate and source electrodes is removed to implement a dielectric between these electrodes comprised of air or the like.

A preferred technique of forming the gate electrode over the photoresist material covering the source electrode is to evaporate a Ti-Pd-Au layer onto the photoresist material followed by the electrolytic growing of gold over the evaporated metal layer.

Preferably, the process for fabricating the present MESFET structure includes applying photoresist material also over the drain electrode, forming a metal layer extension of the gate electrode over such photoresist material, and then etching the extension of the gate electrode situated above the drain electrode so as to remove this portion entirely or to allow a small "tail" or excess portion of the electrode to exist. By allowing for the tail of the gate electrode to extend over the drain electrode, the etching step for removing the metal layer above the drain electrode is not required to be a critically aligned step, thereby resulting in a higher manufacturing yield.

BRIEF DESCRIPTION OF THE DRAWINGS

The foregoing and other objects and advantages of the present invention will be understood from the following drawings, in which.

DETAILED DESCRIPTION OF THE PREFERRED EMBODIMENTS

To provide a more clear description of the novelty and benefits of the present invention, a typical prior art MESFET structure according to the prior art is first considered. The prior art MESFET of FIG. 1 comprises a source electrode S with three longitudinal extensions $S_1$, $S_2$ and $S_3$. A pair of gates G and G' is included. Gate G includes longitudinally extending arms $G_1$ and $G_2$; and, similarly, gate G' includes longitudinally extending arms $G_1'$ and $G_2'$. A drain electrode D has the shape of an upside-down "U" having longitudinally extending arms $D_1$ and $D_2$.

Figure 1:
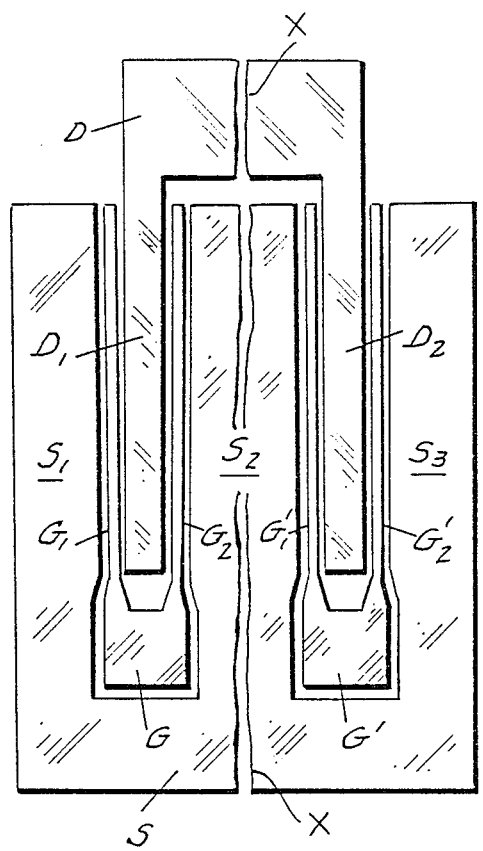
FIG. 1 is a schematic top view of a MESFET structure according to the prior art illustrating a break at line X—X where the illustrated device may be divided into right and left portions.
Figure 1A:
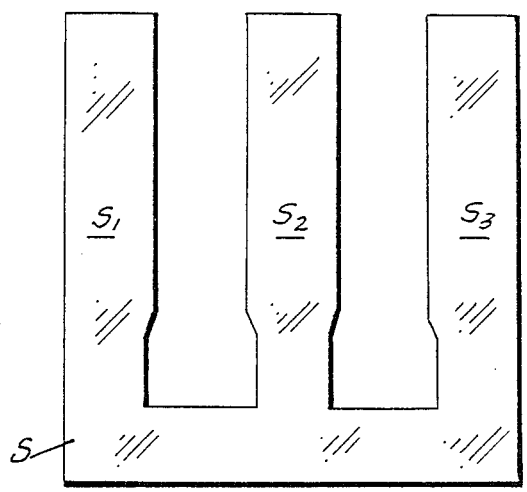
FIGS. 1A, 1B and 1C respectively illustrate source S, gate G and drain D electrodes of the prior art MESFET of FIG. 1.
Figure 1B:
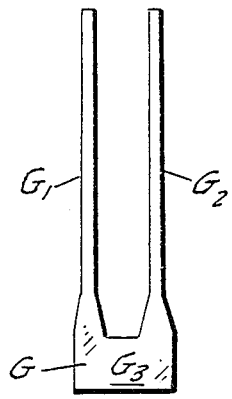
Figure 1C:
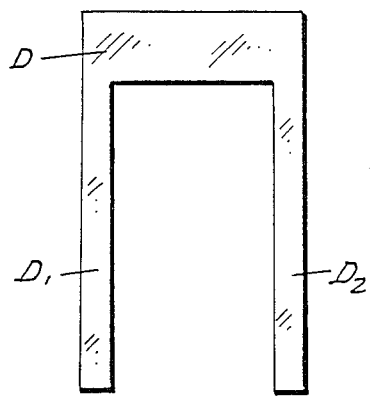

A conventional single MESFET device is obtained by cutting the structure of FIG. 1 into two sections along line X—X. FIGS. 1A, 1B and 1C respectively illustrate source S, gate G and drain D electrodes of the structure shown in FIG. 1. FIGS. 1 and 1A—1C are simplified through deletion of the semiconductor substrate, which is typically gallium arsenide (GaAs).

Referring to FIG. 1B, each gate arm $G_1$ and $G_2$ is typically less than 1 micron in transverse dimension (left to right in the drawings) in order to operate at very high frequencies, which include X-band frequencies (i.e. from approximately 8 GHz to approximately 12 GHz). The length of each arm $G_1$ and $G_2$ (vertical dimension in the drawing) is typically between 150 and 200 microns. Accordingly, when an RF signal is applied to a bonding pad area $G_3$ of gate G, the signal encounters high resistance along the length of the gate arms $G_1$ and $G_2$ and consequently the MESFET device undergoes a degradation in its performance parameters that increases with increasing frequency.

A further drawback with the foregoing MESFET structure is that in order to implement a power device of 1 watt, for example, a large number of individual MESFET devices (such as obtained by cutting along line X—X in FIG. 1) must be connected in parallel with each other. This results in increased device complexity and an increase in the aggregate semiconductor area required, as well as a reduction in the manufacturing yield. Additionally, the large number of required connections and the risk of the error of a signal being fed to the individual MESFET devices with different phase shifts increases.

Figure 2:
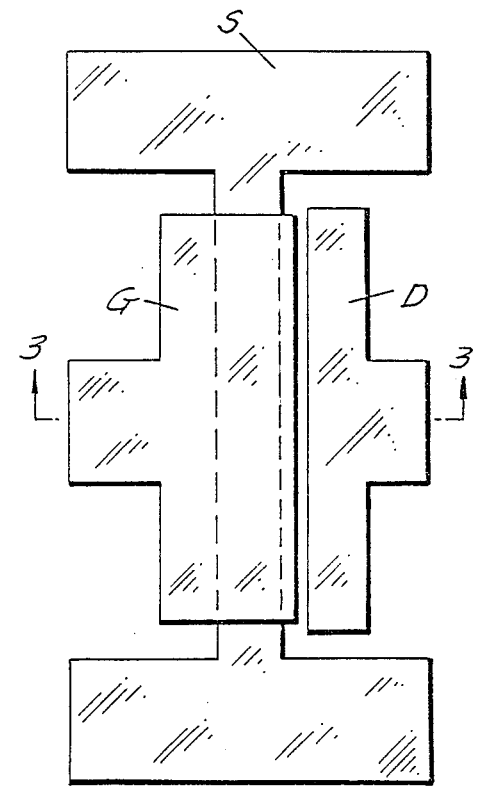
FIG. 2 is a schematic top view of the electrodes of a MESFET device according to the present invention.

To overcome the drawbacks associated with the foregoing MESFET device according to the prior art, a MESFET device according to the present invention is provided as shown in simplified form in FIG. 2. The source, gate and drain electrodes of the MESFET device of FIG. 2 are marked with symbols S, G and D, respectively, as was the case with the prior art MESFET of FIG. 1. The source S, gate G and drain D electrodes are respectively illustrated in FIGS. 2A, 2B and 2C.

Figure 2A:
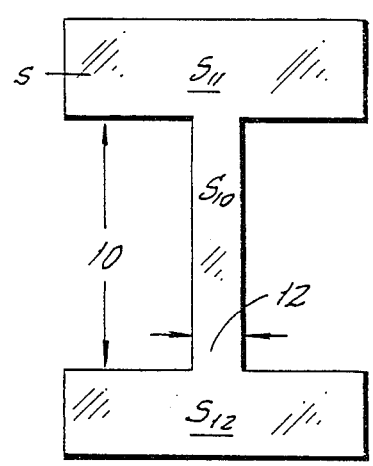
FIGS 2A, 2B and 2C respectively illustrate source S, gate G and drain D electrodes of the MESFET device of FIG. 2.

Referring to FIG. 2A, source electrode S is generally "I"-shaped comprising a central, elongated portion $S_{10}$ and upper and lower "head" sections $S_{11}$ and $S_{12}$, respectively. The head sections $S_{11}$ and $S_{12}$ have a greater lateral dimension (right to left in the drawing) than longitudinal direction (vertically in the drawing). On the other hand, the central member $S_{10}$ between heads $S_{11}$ and $S_{12}$ has a substantially longer longitudinal dimension 10 than lateral dimension 12 (i.e. dimension 10 >> dimension 12). In FIG. 2A, source electrode S has been illustrated as comprising two identical heads $S_{11}$ and $S_{12}$ with segment $S_{10}$ having a constant width 12. It is clear that $S_{11}$ may by different from $S_{12}$, and $S_{10}$ may vary in width along its longitudinal dimension 10.

Figure 2B:
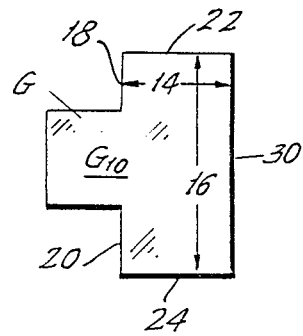

According to an important feature of the invention, gate electrode G comprises a sheet of material having a width 14 substantially greater than width 12 of source electrode S (FIG. 2A) and a height 16 slightly less than height 10 of source electrode S (FIG. 2A). Bonding pad area $G_{10}$ is located only at the left side of gate G and is situated at the center of gate G with respect to its longitudinal dimension 16. Due to this arrangement, sides 18 and 20 of gate G are equal to each other. Additionally, sides 22 and 24 of gate G may be equal to each other. Those skilled in the art will realize that the foregoing geometry and dimensions of the gate G may be varied from that which is illustrated in FIG. 2B without departing from the scope of the present invention.

Figure 2C:
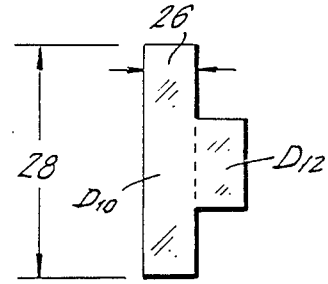

As shown in FIG. 2C, electrode D is substantially different in configuration from the prior art drain electrode D of FIG. 1C. In FIG. 2C, drain D consists of a rectangular body portion $D_{10}$ having a lateral dimension or width 26 substantially equal to width 12 of source S (FIG. 2A) but less than width 14 of gate G (FIG. 2B). Height 28 of drain D is substantially equal to height 16 of gate electrode G.

The geometrical differences between the prior art MESFET electrodes shown in FIGS. 1 and 1A-1C and the present MESFET electrode shown in FIGS. 2 and 2A-2C are substantial, and the overall electrode arrangement shown in FIG. 2 is markedly different from the electrode arrangement of the prior art MESFET shown in FIG. 1.

Figure 3:
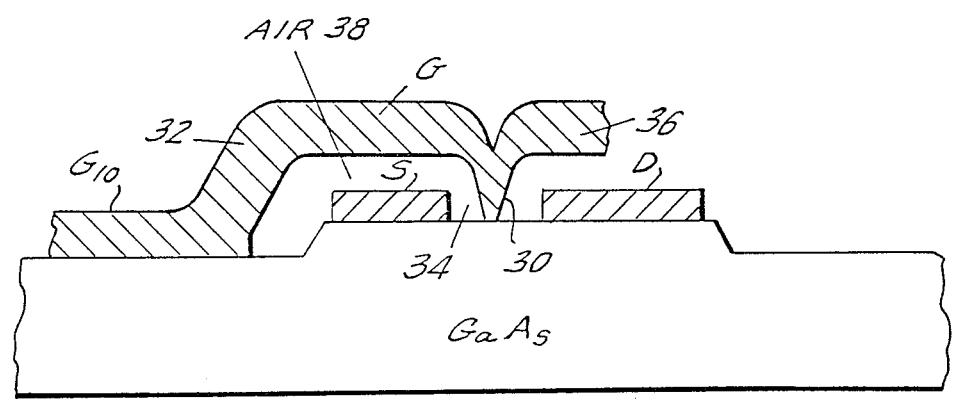
FIG. 3 is a schematic cross-section view taken at lines 3—3 in FIG. 2.

A further novel aspect of the invention is shown in FIG. 3, which is a section taken along lines 3—3 in FIG. 2. In FIG. 3, it can be appreciated that the gate electrode sheet G according to the invention is fixed onto a gallium arsenide (GaAs) substrate with its bonding pad $G_{10}$ on one side, and therefrom it is bridged over source electrode S, via a bypass 32, and is soldered or otherwise connected to active area 34 of the gallium arsenide (GaAs) substrate between source electrode S and drain electrode D with its side 30 making contact to surface 34. To the right of gate edge 30 as shown in FIG. 3, there exists a metallization "tail" or section 36 which is allowed to exist in the structure for purposes of eliminating a critical photoresist and etching procedure, as is described below. Significantly, a layer 38 of air of the like dielectrically separates gate G from source S.

The novel MESFET structure according to the invention illustrated in connection with FIGS. 2, 2A-2C and 3 provides, amongst others, the following advantages:

(1) A drastic reduction of gate electrical resistance, due to gate electrode G being implemented as a sheet of metallization rather than a very thin arm (compare FIGS. 1B and 2B);

(2) The length of the gate (dimension 16 in FIG. 2B) is lower, and also the number of gate electrode arms is significantly reduced; consequently, the dimensions of the individual MESFET devices are substantially reduced by a typical reduction factor of 1:4 passing from a FIG. 1 to FIG. 2; and (3) Without having to utilize electrodes of sub-micron dimensions, the use of 1 micron electrodes, for example, makes it possible to achieve performance similar to that provided by devices employing submicron dimensions; manufacturing yield is accordingly increased through the use of larger dimensions.

On the other hand, the increased dielectric spacing of the gate electrode from the source electrode results in an only negligible increase in the spurious capacitance of the MESFET device.

To reemphasize an important feature of the invention with reference to FIGS. 1B and 2B, the gate G of prior art FIG. 1B includes a gate bonding area $G_3$ connected to an active area of the device along long and thin electrode arms $G_1$ and $G_2$ (e.g., 100–200 microns in length and about 1 micron maximum in width). With the gate electrode G of FIG. 2B, the connection from gate bonding pad area $G_{10}$ to the device active surface is made along the entire edge 30 of the gate, resulting in essentially zero metallization resistance.

In accordance with a preferred process for fabricating the novel MESFET structure described above, FIGS. 4–7 illustrate important steps of the process.

Figure 4:
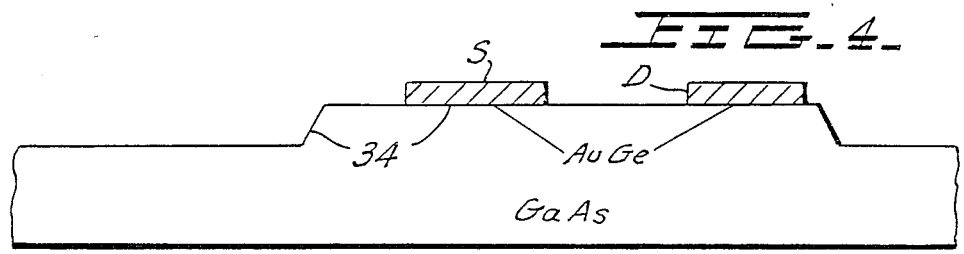
FIGS. 4–7 are schematic cross-section views illustrating various steps used to obtain the novel electrode arrangement of the present invention with an air layer separating the gate and source electrodes.

FIG. 4 illustrates the formation of the active area 34 on the gallium arsenide (GaAs) substrate and implementation of the source S and drain D contacts which may comprise AuGe or Ni, for example.

Figure 5:
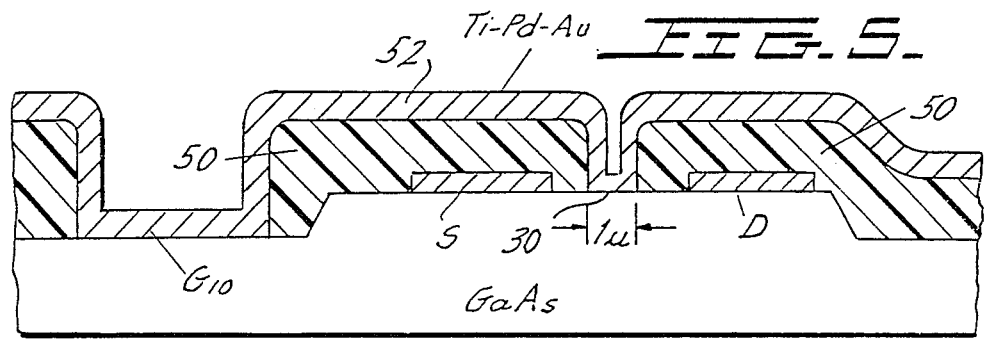

FIG. 5 illustrates the device of FIG. 4 after a photoresist layer 50 has been applied atop the device of FIG. 4, patterned to leave the upper surface of the gallium arsenide (GaAs) substrate exposed at the desired locations for the gate edge 30 and gate bonding pad are $G_{10}$, and the formation of a gate metallization layer 52 which may be formed from evaporation onto photoresist layer 50 of Ti-Pd-Au, for instance.

Figure 6:
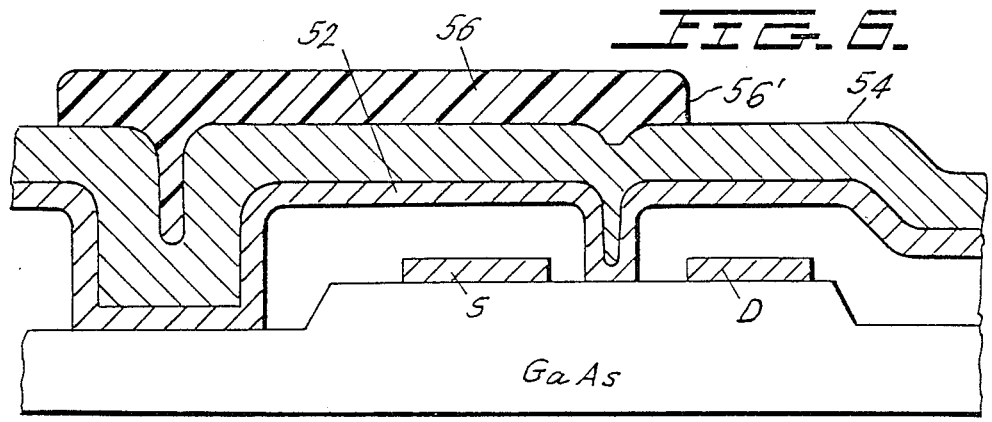

FIG. 6 illustrates a subsequent gate metallization layer 54 formed over layer 52. Layer 54 may be formed through the electrolytic growing of gold to a thickness of 10 microns, for example. Thereafter, a second photoresist layer 56 is formed atop metallization layer 54. The right-most boundary 56' of layer 56 may be partially over drain D to provide for misalignment tolerance in this masking step. Accordingly a non-critical masking operation can be employed to implement photoresist layer 56.

Figure 7:
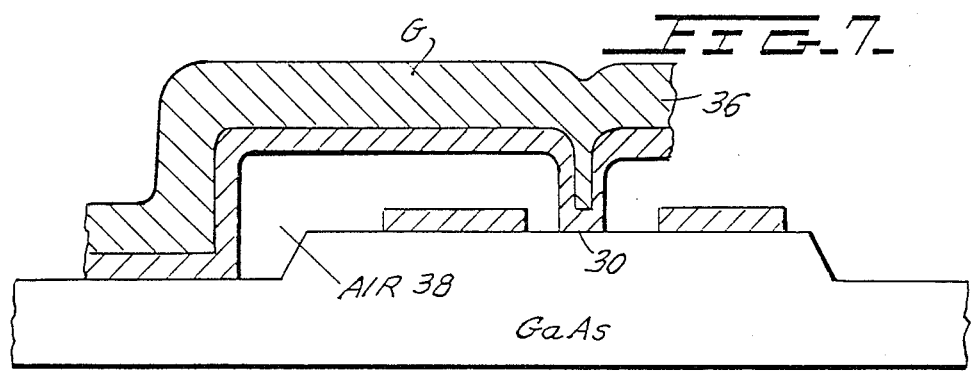

A suitable etchant is then applied to the structure of FIG. 6 to remove selected portions of the gate metallization layer 52, 54. The resulting device structure is shown at FIG. 7 after photoresist layers 50 and 56 have been removed. The region where photoresist layer 50 (FIG. 5) existed above source electrode S is now filled with a layer 38 of air or the like to provide dielectric isolation between gate G and source S. Tail section 36 of gate G is also shown in FIG. 7 and results from the use of a non-critical photolithographic patterning process for gate metallization G.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A process for fabricating a metal-semiconductor field effect transistor, comprising the steps of:
   providing a semiconductor substrate with source and drain electrodes on a major surface of a semiconductor substrate;
   applying photoresist over at least the source electrode while leaving exposed a first portion of said major surface between the source and drain electrodes and a second portion of the major surface on an opposite side of the source electrode from the first portion and which is adapted to receive gate metallization to implement a gate bonding pad;
   forming gate metallization over the photoresist that overlies the source electrode and on the first and second areas of the major surface of the semiconductor surface, whereby the connection of the gate metallization to the first area constitutes the active gate connection of the device while the connection to the gate metallization to the second area implements a gate bonding pad; and
   removing the photoresist between the gate and source electrodes whereby said electrodes are dielectrically separated by each other by a gaseous medium.

2. The fabrication process of claim 1, wherein the step of forming the gate metallization over the photoresist comprises evaporating metal to form a first metallization layer and subsequently growing a second metallization layer thereof by an electrolytic process.

3. The fabrication process of claim 2, wherein the step of evaporating metal to form the first metallization layer comprises evaporation of Ti-Pd-Au, and the step of forming the second metallization layer comprises electrolytic growing of gold.

4. The fabrication process of claim 1, wherein the step of applying the photoresist layer over at least the source electrode includes applying the photoresist over the drain electrode; the step of forming the gate metallization layer over the photoresist layer comprises forming said layer also over the drain electrode; the process further including the step of employing a non-critical photolithographic patterning step to remove at least a portion of the metallization formed over the drain electrode while leaving a tail of said metallization that may vary in length according to the degree of misalignment that is accommodated.

* * * * *